United States Patent

Saeki

[15] 3,637,935

[45] Jan. 25, 1972

[54] KEYED SUBSTRATE FIELD EFFECT TRANSISTOR FREQUENCY-SELECTIVE CIRCUITS

[72] Inventor: Tomoki Saeki, Kawasaki, Japan

[73] Assignee: RCA Corporation

[22] Filed: May 7, 1970

[21] Appl. No.: 35,463

[52] U.S. Cl. ....................................178/5.4 R, 178/69.5 CB

[51] Int. Cl. ....................................................H04n 9/44

[58] Field of Search .......................178/5.4, 5.4 SY, 69.5 CB; 307/251

[56] References Cited

UNITED STATES PATENTS 2,932,689 4/1960 Sonnenfeldt....................178/69.5 CB 3,313,958 4/1967 Bowers, Jr. ............................307/251

*Primary Examiner*—Richard Murray

*Attorney*—Eugene M. Whitacre and Arthur L. Plevy

[57] ABSTRACT

A frequency-selective circuit utilizes a field effect transistor of FET which is operated in a saturation mode by the application of a biasing potential to the substrate. The potential saturates the FET during a signal information containing interval. During a synchronizing interval the substrate bias is altered to enable the field effect device to operate as an active amplifier. The FET then serves to amplify a signal of a predetermined frequency applied to the gate electrode and occurring during the synchronizing interval. The drain electrode of the field effect transistor is coupled to a high quality factor circuit which is responsive to the amplified output signal to provide an extended version of said signal synchronized in frequency and phase thereto.

8 Claims, 2 Drawing Figures

INVENTOR.
TOMOKI SAEKI
BY
Eugene M. Whitaker
Attorney

KEYED SUBSTRATE FIELD EFFECT TRANSISTOR FREQUENCY-SELECTIVE CIRCUITS

This invention relates to frequency selective circuits and more particularly to a crystal "ringing" circuit utilizing a field effect transistor.

The prior art contains a great number of circuits which are, for example, utilized in a color television receiver to provide an output signal which is synchronized to the phase and frequency of an oscillatory burst signal. The burst signal is transmitted with a composite television signal during a color transmission.

Many of the circuits so utilized are typical oscillator circuits. These circuits by having a proper amount of feedback at the color subcarrier reference frequency are designed to oscillator continuously. The burst signal which is retrieved from the composite signal is injected into such an oscillator to lock the frequency of oscillations to the frequency of the burst. Whether the burst is present or absent, the oscillator still serves to provide an output signal. It could be stated that practically every conventional oscillator configuration has been used at one time or another, under the control of a suitable crystal or selective circuit, to provide the continuous wave color subcarrier reference signal.

Relatively early in the development and design of the color receiver, certain individuals realized that the color subcarrier oscillator did not have to be one in which oscillations occurred continuously. Hence, certain prior art techniques employ the use of "ringing" circuits. In such a circuit there is no output unless there is a color transmission and the oscillatory burst signal is present. The "ringing" circuit generally includes a crystal, or other high-Q resonant tank circuit, which is excited by the burst signal as applied thereto. If the circuit is properly designed, when the burst signal is applied to the "ringing" circuit, the crystal or high-Q tank will be excited into oscillations. These oscillations will continue during the duration of the entire television line and will be reexcited at the beginning of each line for each burst as transmitted during the color transmission. In the past receiver manufacturers have attempted to take advantage of the ringing circuit by building a receiver using such a circuit in order to further eliminate the color killer circuit. Theoretically, a ringing circuit will not be energized and therefore will not produce an output if the burst signal were not present. Hence, the status of the ringing circuit could be used as a means of determining whether burst was present or absent depending upon whether or not the circuit provided an output. However, other considerations such as the presence of noise during the burst interval could spuriously excite the crystal to cause false outputs in such a ringing circuit. So a color killer circuit might be included as well.

In any event, when employing a ringing-type circuit, care must be taken to assure that the frequency determining element, such as the crystal, is utilized to its full capability. This implies that in order to operate such a device at the maximum Q, it should be operated in a mode which prevents undesirable loading of the crystal. Such loading tends to reduce the effective Q and therefore increase the band of frequencies that the crystal circuit would be responsive to. It would also be desirable to assure that the ringing circuit would not be energized or controlled during the period of the composite signal in which burst information is not being transmitted. This, of course, is that portion of the signal occurring during the scan interval of the display.

It is therefore an object of the present invention to provide an improved ringing circuit for generating a continuous wave signal upon application thereto of an oscillatory burst signal.

These and other objects of the present invention are accomplished in an embodiment thereof utilizing a field effect transistor. The transistor is arranged in a common source amplifier configuration and has applied to the gate electrode a composite signal. The composite signal contains a number of cycles of an oscillatory burst reference signal during a predetermined time interval of said signal. The substrate electrode of the field effect transistor is biased by means of a suitable potential to saturate the source to drain path of the field effect transistor. During the predetermined time interval the bias on the substrate is changed to enable the field effect transistor to operate as an active amplifier. The burst frequency as applied to the gate electrode is amplified at the drain electrode to which is coupled a high quality factor selective network. The amplified burst serves to excite the selective network into oscillations to provide a continuous wave signal, which is synchronized to the phase and frequency of the applied burst.

These and other objects of the present invention will become clear if reference is made to the foregoing specification when read in conjunction with the accompanying figures, in which.

Figure 1:
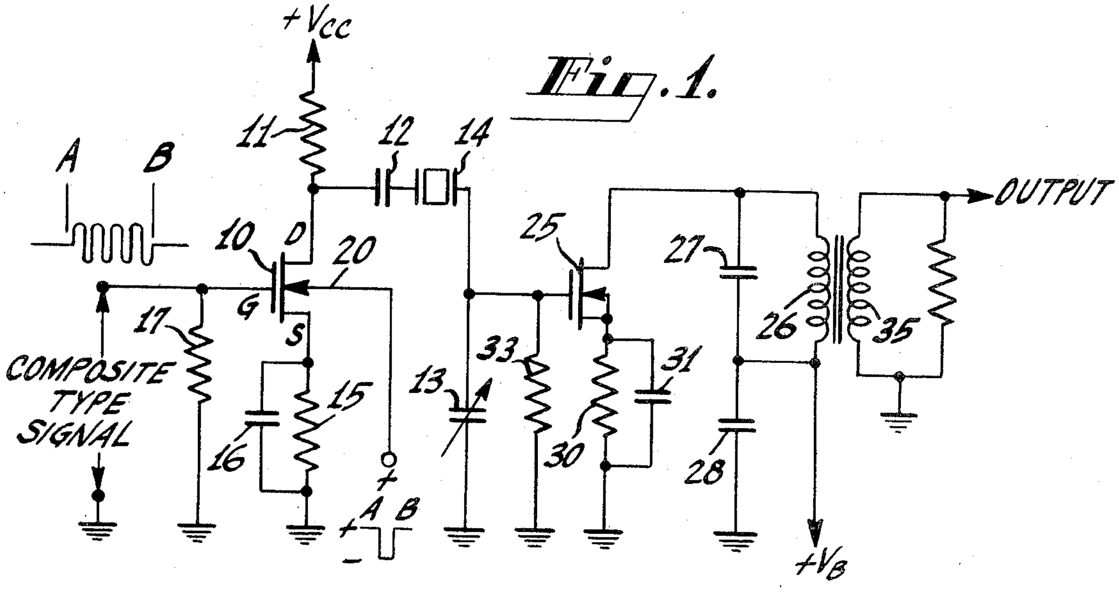
FIG. 1 is a schematic diagram of a frequency selective circuit according to this invention.

Referring to FIG. 1, there is shown a field effect transistor 10 or FET which may be an MOS FET device. The drain electrode of the field effect transistor is coupled to a point of operating potential +Vcc through a load resistor 11. Also coupled to the drain electrode is a DC blocking capacitor 12 in series with a crystal 14. Crystal 14 is returned to ground through a variable capacitor 13. The field effect transistor 10 is a semiconductor device which possesses characteristics similar to pentode vacuum tubes. Such devices, for example, have extremely high input impedances together with relatively high output impedances as opposed to those impedances of a typical transistor. The source electrode of the field effect transistor 10 is returned to a point of reference potential through a source bias resistor 15 in shunt with a bypass capacitor 16.

Basically, the configuration employing the field effect transistor 10 is a common source amplifier somewhat analogous to the common emitter transistor amplifier or the common cathode vacuum tube amplifier. Such MOS devices have an input electrode which is commonly referred to as the gate electrode. It is to this electrode that the signal to be amplified is applied. The gate electrode of the field effect transistor 10 is returned to a source of reference potential via a gate return resistor 17. The signal which is applied across resistor 17 is a composite-type signal which may, for example, be a television signal. The figure shows a number of cycles of a predetermined frequency occurring within the interval A and B, which frequency is the one of interest. A great number of MOS devices also have another electrode available which is commonly referred to as the substrate electrode. The substrate electrode 20 of the field effect transistor 10 is coupled to a pulse source for rendering the MOS FET 10 active during the interval A and B. Also shown is a tuned amplifier stage including a field effect transistor 25 having its drain electrode coupled to a resonant tank circuit comprising the parallel combination of an inductor 26 and a capacitor 27. One terminal of the inductor is coupled to a source of operating potential +Vb which point is bypassed by means of a capacitor 28. The source electrode of the field effect transistor 25 is coupled to ground through a self-biasing network including the parallel combination of resistor 30 and capacitor 31. The gate electrode of the field effect transistor 25 is returned to the point of reference potential via the gate resistor 33 and is also coupled to the junction between the crystal 14 and variable capacitor 13.

The operation of the circuit will be described with reference to a television type signal being applied to the gate electrode of the field effect transistor 10. It is understood that the circuit will operate with other signals as well.

The composite signal as applied to the gate electrode of the field effect transistor 10 contains video or other types of information during a first predetermined interval thereof, and also contains, during a synchronizing interval, a number of cycles of an oscillatory burst reference signal. This burst signal is used for a reference to properly perform demodulation of the chrominance information contained within the composite signal. In operation the substrate electrode 20 of the field effect transistor 10 is maintained at a positive level during that portion of the composite signal containing the chrominance and video information. During the synchronizing interval the substrate is caused to go negative by means of a pulse derived from the synchronizing components transmitted with the composite signal. When the negative going pulse is applied to the substrate, the field effect transistor 10 becomes biased in its active region and serves to amplify the signal present at its gate electrode at this time. Due to the selection of the pulse as occurring during the synchronizing interval, the signal present at this time is the oscillatory burst signal. Therefore, the amplified burst frequency is provided at the drain electrode of the field effect transistor 10. This amplified oscillatory burst signal is coupled to the crystal 14 via capacitor 12. The crystal is selected to have have a self-resonant frequency about the same as the anticipated burst frequency. The crystal 14 being a very high-Q element is "shock-excited" into oscillations by means of the burst. As is well known, because of the narrow bandwidth afforded by the crystal, the frequency and phase of the signal provided by the crystal will by synchronized to the frequency and phase of the amplified burst. The output of the crystal is coupled to the gate electrode of the field effect transistor amplifier 25. The amplifier 25 serves to further amplify the level of the signal and provides further selectivity by means of the above-mentioned tank circuit. Because of the high-Q of the crystal, the circuit will sustain oscillations at a relatively constant amplitude during the entire scan or information bearing interval associated with the composite signal. A secondary winding 35 associated with the inductor 26 may be coupled to a suitable demodulator circuit for utilizing the burst-synchronized, continuous wave output signal.

The circuit as described above provides the following advantages.

First, by applying the positive signal on the substrate of the field effect transistor 20 during the scan time, one obtains a very low saturation resistance for the field effect transistor because of the forward biasing of the substrate-to-drain diode and the substrate-to-source diode.

In an MOS field effect transistor 10, there are back-to-back diodes between the drain and source electrodes which represent respectively the junction formed between the heavily diffused drain region and the semiconductor substrate, and the junction formed between the heavily diffused source region and the substrate. These back-to-back diodes are in parallel with the channel of the MOS field effect transistor. In many amplifier applications, as for the MOS field effect transistor amplifier 25, the substrate is connected to the source, resulting in the back biasing of the diode between drain and substrate and the short circuiting of the diode between source and substrate.

However, by applying a potential on the substrate as shown herein, one serves to forward bias both diodes and hence the output or drain electrode of transistor 10 is returned to ground through this low impedance path. Therefore, the output resistance of the MOS field effect transistor 10 approaches a relatively small value, thus effectively providing a ground return for capacitor 12 and hence for that terminal of the crystal 14 coupled thereto. The other terminal of the crystal 14 is terminated by the very large input impedance afforded by the gate electrode of the MOS field effect transistor amplifier 25 in shunt with resistor 33 and capacitor 13. The crystal 14 is relatively unloaded by this input impedance and can therefore provide an adequate voltage across the same. The forward biasing of the substrate to drain and source diodes of transistor 10 serves to prevent the spurious coupling of the chrominance signal from falsely activating the crystal 14 during the scan time of the composite signal. Therefore, the output of the circuit as to phase and frequency is primarily determined by the phase and frequency of the burst signal as applied to the gate electrode of the field effect transistor 10. During a monochrome transmission there is no burst signal present and even though the substrate may still be pulsed as shown, no output voltage would exist and the crystal would not be activated. However, it is apparent that by using a conventional color killer circuit the substrate, during a monochrome transmission, may be maintained constantly at the positive level. This would operate the field effect transistor 10 in saturation and therefore assure that the crystal 14 will not be spuriously excited by extraneous noise pulses.

A circuit which was built and successfully operated according to the schematic shown in FIG. 1 utilizes the following:

| | |
|---|---|
| Resistor 11 | 5.0 kilohm |
| Resistor 15 | 1.2 kilohm |
| Resistor 17 | 1.0 megohm |
| Resistor 33 | 1.0 megohm |
| Resistor 30 | 1.2 kilohm |
| Capacitor 12 | 200 micromicrofarads |
| Capacitor 13 | 10–20 micromicrofarads |
| Capacitor 16 | 0.1 microfarads |
| Capacitor 31 | 0.1 microfarads |
| Capacitor 27 | 30 micromicrofarads |
| Inductor 26 | 50–70 microhenries—turns ratio 3:1 primary 26 to secondary 35 |
| MOS FET 10 & 25 | 3N128 |
| +Vcc | +20 volts |
| +Vb | +10 volts |

Figure 2:
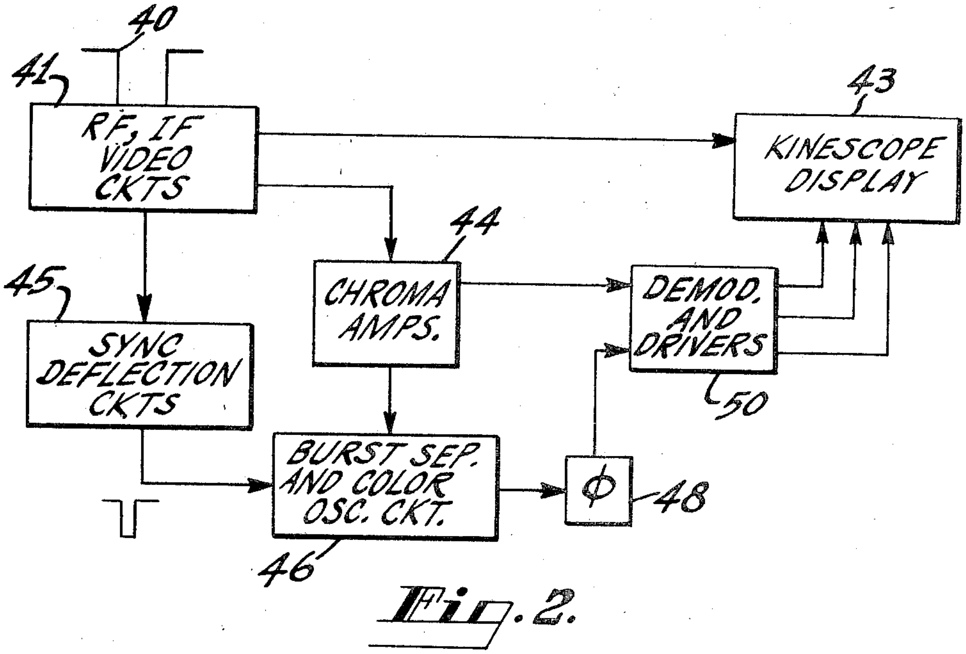
FIG. 2 is a block diagram of a color television receiver incorporating the circuitry described in this invention.

Referring to FIG. 2, there is shown a block diagram of a color television receiver in which the above-described circuit may be used.

An antenna 40 receives a transmitted television signal and applies the same to conventional television processing front end circuitry including the radiofrequency (RF) amplifier, intermediate frequency (IF) amplifier, video detector and associated circuits 41. The luminance component which is processed by the conventional luminance channel is applied to appropriate electrodes of a kinescope display means 43 which may, for example, be a three-gun shadow mask device. The video signal also contains chrominance information which determines the colors to be displayed on the kinescope and hence the composite signal is also applied to a series of one or more chrominance amplifiers 44. Synchronization information is also transmitted along with the composite signal and is necessary to determine the proper generation of a raster to display the retrieved luminance and chrominance information in proper sequence on the face of the kinescope display 43. The sync and deflection circuits 45 serve to provide suitable wave shapes for the kinescope display, generated according to the transmitted sync information. An output from the chrominance amplifiers 44 is applied to a module 46 designated as the burst separator and color oscillator circuit. Another input to this module is obtained from the sync and deflection circuits 45. This input is a pulse occurring during the synchronizing interval and encompassing that period commonly referred to as the back porch interval. This is the interval that the requisite number of cycles of the oscillatory burst signal or color reference signal is transmitted during a color transmission. The circuit of FIG. 1 as described above can be utilized to perform the functions required of module 46. Accordingly, the signal applied to the circuit from the chrominance amplifiers 44 would be that signal applied to the gate electrode of field effect transistor 10 of FIG. 1. Likewise the signal applied from the sync and deflection circuits 45 would be that signal applied to the substrate electrode of the field effect transistor 10. The function of the module 46 is, therefore, to supply a continuous wave subcarrier reference signal as obtained, for example, across the secondary winding 35 of FIG. 1. This signal is applied to a phase shifting circuit 48 prior to the application of the signal to suitable demodulator and drive circuits 50. The purpose of the phase shifting circuit 48 is to provide the consumer or viewer with a means of adjusting the reference phase in order to affect tint control of the display. The demodulator and driver circuits 50 serve to demodulate the chrominance signals with respect to the phase and frequency of the color reference subcarrier signal to provide, for example, color difference signals for application to the appropriate electrodes of the kinescope display 43. If the circuit of FIG. 1 is utilized, as explained above, as a ringing circuit, the manufacturer may conveniently do away with the conventional color killer circuit. He would therefore rely on the fact that the color reference subcarrier signal will not be present during a monochrome transmission because of the absence of burst and the above-described circuit operation.

The circuit shown, as previously mentioned, could also be used in a receiver as a "ringing" circuit in conjunction with a color killer circuit of affording noise immunity and additional transient protection if desired.

It is also apparent that in view of noise considerations or for other reasons, the manufacturer desires to so employ a color killer circuit, then the circuit shown in FIG. 1 can conveniently be used to provide, for example, the functions of a burst separator. Therefore, as the circuit provides a signal locked in frequency and phase to the burst signal, such a signal may be applied to a suitable oscillator circuit to injection lock the same or to suitable ACC (automatic chroma control) and color killer phase detector circuits as a reference. If the circuit shown in FIG. 1 were utilized as a burst separator, all of the above described advantages concerning chroma leakage, noise immunity, and reliability of operation would be available as well.

What is claimed is:

1. A frequency-selective circuit of the type employing a high quality factor filter network to be excited into oscillations by applying a signal thereto which includes periodic bursts containing a predetermined number of cycles of a frequency within the band-pass response of said filter, comprising, a. a field effect transistor having a source, drain, gate and substrate electrode, b. means coupling said high quality factor filter network between said drain and source electrodes, c. means coupled to said gate electrode for applying said burst signal thereto, d. means coupled to said substrate electrode for saturating the drain to source path of said field effect transistor in a first mode and for periodically enabling said field effect transistor in a second mode for a time duration encompassing said predetermined number of cycles to cause said burst signal to excite said filter network coupled to said drain electrode.

2. THe frequency-selective circuit according to claim 1, wherein said high quality factor filter network includes a crystal element coupled between said drain electrode and a point of reference potential.

3. The frequency-selective circuit according to claim 1, wherein said field effect transistor is a MOS device.

4. A frequency-selective circuit, comprising, a. a field effect transistor having a source, drain, gate, and substrate electrode, b. means coupling said source electrode to a point of reference potential, c. means coupled to said gate electrode for applying a first signal thereto, having a given number of cycles of a specified frequency occurring only during a given interval, d. a frequency-selective circuit coupled to said drain electrode of said field effect transistor and having a frequency response centered about said specified frequency, e. means coupled to said substrate electrode for disabling said field effect transistor during a first interval and for enabling said field effect transistor during said given interval to cause said transistor to amplify said given number of cycles of said specified frequency.

5. The frequency-selective circuit according to claim 4 further comprising, a. a second field effect transistor having gate, source and drain electrodes, said second field effect transistor arranged in a common source amplifier configuration, b. a high-impedance resistive device coupled between said second transistor's gate electrode and a source of reference potential, c. means coupling said gate electrode of said second transistor to said frequency selective circuit, d. output utilization means coupled between said drain and source electrodes responsive to said specified signal frequency.

6. A circuit for selectively responding to a burst signal containing a number of cycles of a predetermined frequency and occurring within a first time interval contained within a longer predetermined time interval associated with a composite signal, to develop therefrom a signal of the same phase and frequency as said burst and having a duration substantially equal to said longer predetermined time interval, comprising, a. a field effect transistor having a source, drain, gate and substrate electrode, b. means coupled to said gate electrode for applying said composite signal thereto, c. means coupled to said substrate electrode for saturating said drain to source path of said field effect transistor for said portion of said predetermined time interval not including said burst, and for enabling said drain to source path during said first time interval including said burst to permit said field effect transistor to operate as an amplifier, d. a high quality factor selective network coupled between said drain and source path of said transistor, and having a frequency response centered about said burst frequency whereby said network is excited into oscillations during said given interval because of said burst amplification afforded by said field effect transistor, said quality factor being sufficient to sustain said oscillations during said entire longer predetermined time interval.

7. The circuit according to claim 6 wherein said composite signal is a television signal, said first interval is said synchronizing interval and said burst signal is said color reference subcarrier signal.

8. The circuit according to claim 7 wherein said high quality factor network includes a crystal element, having a natural frequency of oscillations substantially about said color reference subcarrier frequency.

* * * * *